US006733586B2

(12) United States Patent
Myerson

(10) Patent No.: US 6,733,586 B2
(45) Date of Patent: May 11, 2004

(54) HIGH THROUGHPUT NON-PHOTOCHEMICAL LASER INDUCED NUCLEATION

(75) Inventor: Allan S. Myerson, Chicago, IL (US)

(73) Assignee: Illinois Institute of Technology, Chicago, IL (US)

( * ) Notice: Subject to any disclaimer, the term of this patent is extended or adjusted under 35 U.S.C. 154(b) by 0 days.

(21) Appl. No.: 10/222,506

(22) Filed: Aug. 16, 2002

(65) Prior Publication Data

US 2003/0101926 A1 Jun. 5, 2003

Related U.S. Application Data

(63) Continuation-in-part of application No. 09/918,935, filed on Jul. 31, 2001, now Pat. No. 6,596,077.

(51) Int. Cl.[7] .............................................. C30B 21/02
(52) U.S. Cl. .................... 117/68; 117/935; 204/157.15; 204/157.41; 204/157.61; 204/157.81; 204/157.9
(58) Field of Search ............. 117/68, 935; 204/157.15, 204/157.41, 157.61, 157.81, 157.9

(56) References Cited

U.S. PATENT DOCUMENTS

| 4,330,363 | A |  | 5/1982 | Biegesen et al. |  |
|---|---|---|---|---|---|
| 4,737,232 | A |  | 4/1988 | Flicstein et al. |  |
| 5,271,795 | A |  | 12/1993 | Ataka et al. |  |
| 5,683,935 | A |  | 11/1997 | Miyamoto et al. |  |
| 5,948,363 | A |  | 9/1999 | Gaillard |  |
| 5,976,325 | A |  | 11/1999 | Blanks |  |
| 6,027,565 | A | * | 2/2000 | Bugg et al. | 117/202 |
| 6,055,106 | A |  | 4/2000 | Grier et al. |  |
| 6,406,903 | B2 | * | 6/2002 | Bray et al. | 435/235.1 |
| 6,408,047 | B1 |  | 6/2002 | Kitagawa |  |
| 6,426,406 | B1 | * | 7/2002 | Myerson et al. | 50/418 |

FOREIGN PATENT DOCUMENTS

WO WO 01/51919 A2 7/2001

OTHER PUBLICATIONS

Zaccaro et al., "Nonphotochemical, Laser Induced Nucleation of Supersaturated Aqueous Glycine Produces Unexpected Polymorhp"., Crystal Grwoth and Design vol. 1 No. 1 2001 pp. 5–8.*
Wilson et al., "Control of solvent evaporation inhen egg white lysozyme crystallization", Journal of Crystal Growth vol. 116 pp. 414–420 1992.*
Garetz et al., Phys. Rev. Lett. 77, 3475 (1996).
Rosenberger, F., Fundamentals of Crystal Growth (Springer–Verlag, Berlin, 1979).
Chernov, A.A., Modern Crystallography III Crystal Growth (Springer–Verlag, Berlin, 1984).
McPherson, A., Eur. J. Biochem., 189, 1 (1990).
Rosenberger, F., et al., J. Crystal Growth, 168, 1 (1996).
Pusey, M.L., J. Crystal Growth, 110, 60 (1998).
McPherson, A., et al., Structure, 3, 759 (1995).
Geroge, A., et al., Acta Cryst., D50, 361 (1994).
Rosenbaum, D.F., et al., Phys. Rev. Lett., 76, 150 (1996).
Rosenbaum, D.F., et al., J. Crystal Growth, 169, 752 (1996).
Rosenberger, F., J. Crystal Growth, 76, 618 (1986).

* cited by examiner

Primary Examiner—Robert Kunemund
(74) Attorney, Agent, or Firm—Technoprop Colton LLC

(57) ABSTRACT

A method for the high-throughput non-photochemical laser induced nucleation of crystals from aged supersaturated solutions in which short high-intensity laser pulses are used to induce nucleation in an array or sequence aged supersaturated solutions. The laser reduces nucleation time and induces nucleation only in the area where the beam is focused or passes through, resulting in fewer nuclei than would be achieved by spontaneous nucleation. The high-throughput methodologies allow more crystals to grow in a given amount of time.

87 Claims, 10 Drawing Sheets

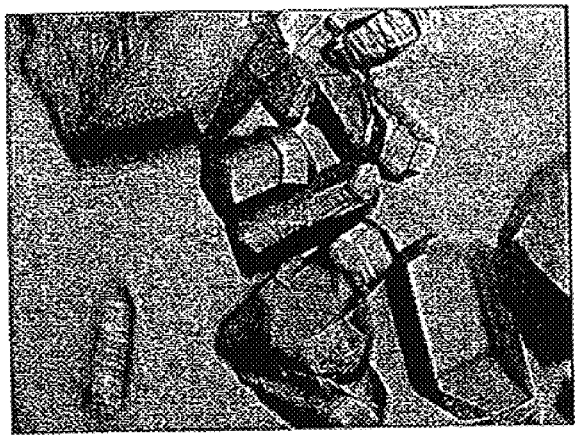 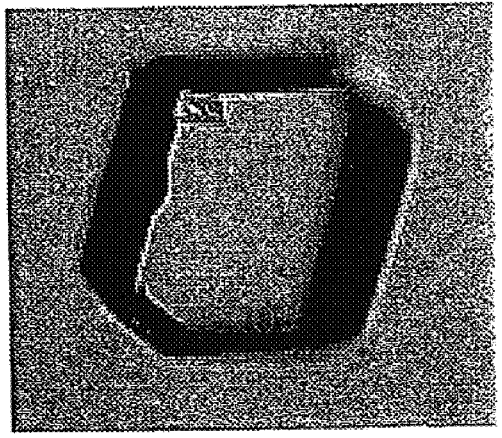
FIG. 7A                     FIG. 7B

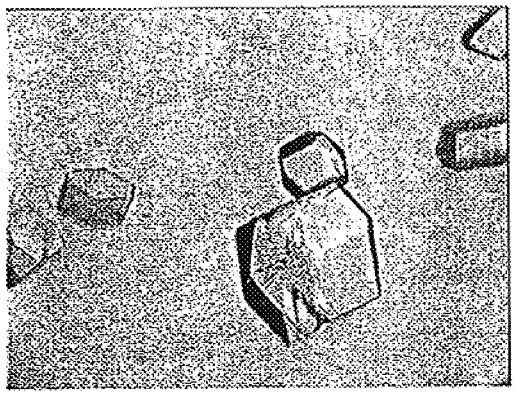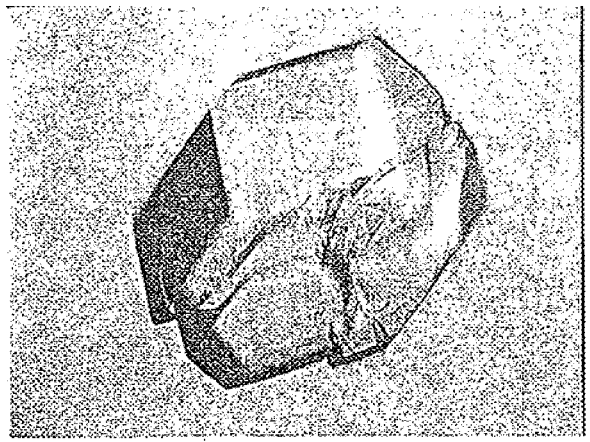
FIG. 8A
FIG. 8B

HIGH THROUGHPUT NON-PHOTOCHEMICAL LASER INDUCED NUCLEATION

STATEMENT OF RELATED APPLICATIONS

This patent application is a continuation-in-part of U.S. application Ser. No. 09/918,935, having a filing date of Jul. 31, 2001, now U.S. Pat. No. 6,596,077.

BACKGROUND OF THE INVENTION

1. Technical Field

The technical field of the present invention is generally the high throughput controlled nucleation of crystals, and more specifically a high-throughput method for the non-photochemical laser induced nucleation of crystals, including protein crystals.

2. Prior Art

A new method to induce and control nucleation developed by this inventor, among others, is known as non-photochemical laser induced nucleation. Garetz et al., Phys. Rev. Left. 77, 3475 (1996). In this method, short high-intensity laser pulses have been shown to induce nucleation in supersaturated solutions or urea.

The growth of crystals for structure determination relies on spontaneous nucleation. Seeded growth is normally not practical, since it would require a good quality crystal, which is not available. Other methods routinely used in small-molecule crystal growth such as cooling and the more common evaporation methods do not allow for nucleation control. Since an important purpose of crystal growth experiments is to crystallize a few large high quality crystals, uncontrolled spontaneous nucleation is a significant problem. This is true even in the case of protein crystals. For example, in the experiments using the "hanging droplet" technique, two to three nuclei per drop would usually result in large crystals of high quality while larger numbers of nuclei per drop would not. Nucleation is known to strongly depend on supersaturation. Rosenberger, F., Fundamentals of Crystal Growth (Springer-Verlag, Berlin, 1979); Chernov, A. A., Modern Crystallography III Crystal Growth (Springer-Verlag, Berlin, 1984); and McPherson, A., Eur. J. Biochem., 189, 1 (1990). Such dependence demands precise regulation of protein supersaturation, precipitant concentration, pH, purity, thermal history and temperature.

Nucleation requires that molecules aggregate together in clusters and these clusters reach a critical size where they are thermodynamically favored to grow. In addition, the molecules must overcome the entropic barrier and arrange themselves in the appropriate lattice arrangement for the resulting nuclei to be crystalline. The higher the supersaturation, the smaller the critical radius. Rosenberger F. et al., J. Crystal Growth, 168, 1 (1996). For example, because the metastable zones of protein solutions are much wider than those of small molecules, the nucleation of crystalline proteins begins at very high levels of supersaturation (often several hundred to thousand percent). Pusey, M. L., J. Crystal Growth, 110, 60 (1998); and McPherson, A., et al., Structure, 3, 759 (1995). Proteins often can nucleate and grow in an amorphous form. This generally is not desired. Recent work has shown that the second virial coefficient can be used to identify solution conditions favorable for crystallization. George, A. et al., Acta Cryst., D50, 361 (1994); Rosenbaum, D. F. et al., Phys. Rev. Lett., 76, 150 (1996); and Rosenbaum, D. F. et al., J. Crystal Growth, 169, 752 (1996).

In 1996, during a study designed to investigate whether supersaturated urea solutions would display non-linear optical properties similar to those of urea crystals because of the presence of ordered molecular clusters, the present inventor discovered serendipitously that the solutions nucleated. Garetz et al., Phys. Rev. Left. 77, 3475 (1996). The experiment involved the use of pulses of linearly polarized near infrared laser light. This wavelength of light was non-absorbing in urea solutions, which ruled out a photochemical mechanism. It was postulated that there was an alignment of molecules along the direction of the polarization due to the optical Kerr effect that reduced the entropy barrier to crystallization. Further studies of laser induced nucleation in the laboratories of the present inventor have demonstrated that the laser will induce nucleation in other substances (I-alanine, glycine, adipic acid, succinic acid), will reduce the nucleation induction time significantly when compared to an identical control.

With regard to protein crystals, complete or highly detailed steric structures of proteins are indispensable information for an understanding of the specific properties and functions of the proteins. For example, information on the three-dimensional structure of a protein can serve as the basis for understanding the mechanism of function appearance in a biochemical system by an enzyme or hormone. In many fields, such as pharmaceutical science and chemical engineering, the three-dimensional structure of a protein can provide information for basic molecular design, specific drug design, protein engineering, biochemical synthesis and the like.

X-ray crystal structural analysis is the most cogent and high-accuracy means of obtaining three-dimensional steric structural information of proteins at atomic levels at present. Thus, to determine the three-dimensional structure of a protein by X-ray crystal structural analysis, one must have protein crystals of sufficient size and quality. Crystallization of a protein currently is performed by eliminating a solvent from an aqueous or anhydrous solution containing the protein, resulting in a supersaturated state and growing a crystal. However, there are several problems in protein crystallization conducted-using the current art.

As discussed previously, it is difficult to obtain a crystal of excellent crystallinity or a large-sized single crystal. One reason may be that a biological macromolecule is readily influenced by gravity since its molecular weight is generally large and causes convection in the solution. Rosenberger, F., J. Cryst. Growth, 76, 618 (1986). This convection can reduce the crystal growth rate, or can cause anisotropic growth. Proteins also are sensitive to the crystallization conditions. The environment, pH, ionic strength and temperature of the solution, and type and dielectric constant of the buffer solution, and the like, can affect protein crystal growth. As a result, it has been difficult to obtain acceptable quantities of acceptable protein crystals, with most protein crystals being small, of less than excellent crystallinity, and in small quantities. Thus, crystallization of proteins is the weakest link in X-ray crystal structural analysis.

Others have used lasers to induce the crystallization of materials. For example, U.S. Pat. No. 4,330,363 to Biegesen et al. discloses thermal gradient control for enhanced laser-induced crystallization of predefined semiconductor areas and does not disclose or pertain to protein areas. Biegesen '363 discloses a specific method of converting predefined areas of semiconductor material into single crystal areas and does not apply to the lased-induced nucleation of protein crystals or the controlled nucleation of protein crystals.

U.S. Pat. No. 4,737,232 to Flicstein et al. discloses a process for depositing and crystallizing a thin layer of organic material using laser energy. Flicstein '232 discloses a specific method of depositing and crystallizing a thin layer of an organic material on a substrate, and using the laser to desorb material, and also does not apply to the lased-induced nucleation of protein crystals or the controlled nucleation of protein crystals.

U.S. Pat. No. 5,271,795 to Ataka et al. discloses a method of growing large crystals by locally controlling solution temperatures. Ataka '795 discloses a method for growing protein crystals using the temperature dependence of solubility of a crystalline protein material, causing the protein crystals to be deposited by controlling the temperature of a localized portion of the solution. No laser is disclosed or suggested to induce or control the nucleation of protein crystals, the crystallization occurring by using warm water.

U.S. Pat. No. 5,683,935 to Miyamoto et al. discloses a method of growing semiconductor crystals only and does not disclose or pertain to protein areas. Miyamoto '935 discloses a specific method of semiconductor crystallization by using laser light. This invention pertains to semiconductors, and does not have the same applicability to liquid solutions containing proteins.

U.S. Pat. No. 5,976,325 to Blanks discloses the laser-induced nucleation of purified aluminum hydrate crystals, including in supersaturated solutions. Although Blanks '325 possibly can be applied to other supersaturated solution, there is no teaching or suggestion of using the process on organic materials or in fields unrelated to aluminums.

U.S. Pat. No. 6,055,106 to Grier et al. discloses a method and apparatus using laser light to assemble or direct particulate materials. Grier '106 discloses a method for manipulating a plurality of biological objects including the crystallization of proteins. However, the invention is an optical trap that splits a single light beam into several, focuses the several light beams to form a focused spot for forming the optical trap, which is unrelated to the present invention.

High-throughput analysis systems are known in the art and are useful for various production, analysis and testing methodologies. For example, high-throughput systems in general are useful for (1) the rapid production of mixtures by automatically mixing components in series or in parallel; (2) analyzing samples by optical or analytical techniques to determine the make-up of the samples in series or in parallel; and (3) testing samples to determine the suitability of the samples for desired characteristics. High-throughput systems range from manual systems such as a series of hanging drops or pipettes acted upon sequentially, to automated systems such as two-dimensional arrays of test tubes or micro-wells acted upon by robotic systems sequentially or in parallel.

U.S. Pat. No. 5,948,363 to Gaillard illustrates a representative type of micro-well that is useful in high-throughput systems. Gaillard '363 shows both one- and two-dimensional arrays of micro-wells. Similarly, U.S. Pat. No. 6,235,520 to Malin illustrates a high-throughput screening apparatus useful for screening the effect of test compounds. Malin '520 shows a two-dimensional array of micro-wells in which the change of conductance can indicate various properties of the species contained in each micro-well.

U.S. Pat. No. 6,408,047 to Kitagawa discloses a method of providing high-throughput protein crystallography. Kitagawa '047 uses a robotic arm that grasps an individual sample and is operated under automatic control, such as by a program stored within the robotic device or on a separate, connected computer. Once a sample is selected and gripped by the robotic arm, the arm is then moved to the necessary position, positioning the sample holder so that the sample will be placed in a known spatial relationship to an x-ray source and a detector. The process is repeated for subsequent samples.

PCT Patent Publication No. WO 01/51919 to Levinson discloses the use of a 96-well micro-well array for the high-throughput formation, identification, and analysis of diverse solid-forms. Levinson '919 illustrates the use of commonly available two-dimensional arrays of micro-wells for rapidly screening many samples in parallel. Samples are placed in the micro-wells and then monitored for emerging characteristics.

Thus, while lasers have been used to induce crystallization and high-throughput systems have been used to characterize samples, it can be seen that no one has developed a successful method for the controlled high-throughput nucleation of crystal growth that results in the efficient and rapid production of crystals. Also, it can be seen that no one has developed a successful method for the start-to-finish nucleation and screening of crystals using the same high-throughput process and apparatus. Further, it can be seen that no one has developed a successful method for the controlled high-throughput nucleation of protein crystal growth that results in the efficient and rapid production of protein crystals. The present invention is directed to these needs.

BRIEF SUMMARY OF THE INVENTION

The conditions required to grow many crystals are known. However, crystallization of a sufficient quantity and quality of crystals for structural analysis and other reasons is a rate-limiting step for a significant number of compounds, such as proteins. This rate-limiting step arises because even though solutions of compounds of interest generally are prepared at high levels of supersaturation, many such solutions still do not readily nucleate. In fact, it is common for some compounds to take several weeks or more to crystallize. Thus, it often is a long and arduous process to produce crystals in general and protein crystals in specific.

The present invention resolves this rate-limiting step by using non-photochemical laser-induced nucleation (NPLIN) in combination with high-throughput process methods and apparatuses to produce and screen crystals, resulting in a relatively greater number of crystals of superior quality and larger size in the same or a reduced amount of time and, potentially, with less costly human interaction. The present invention balances the desire to control crystal growth so as to achieve superior crystals with the desire to produce a larger quantity of superior crystals in less time.

In one embodiment of the present invention, one purpose of controlling protein crystal growth is to produce protein crystals of superior quality and larger size for structure determination by x-ray crystallography and other characterizing processes. For example, the general NPLIN method disclosed herein can result in an improved rate of protein crystal production and an improvement in the quality of protein crystals needed for the determination of structures. Illustrative analyses of proteins such as, for example, lysozyme and bovine insulin, and elastase shows that NPLIN results in fewer, larger protein crystals that grow in a significantly shorter amount of time than spontaneous systems with no loss of protein crystal quality. More specifically, the protein crystals themselves do not grow faster, but the time for initial nucleation is reduced, thus making the entire process faster. Therefore NPLIN offers a viable alternative for achieving high throughput (or at minimum increased throughput) crystallography.

In another embodiment of the present invention, the quantity of crystals nucleated in a solution determines ultimate size, while solution composition, pH, supersaturation, temperature and purity control the crystal quality and structural resolution. It has been found that control of nucleation at appropriate crystallization conditions would improve the size and quality of crystal. In addition, it has been found that the ability to induce nucleation on demand (or to reduce the nucleation induction time) allows more successful crystal growth in shorter time periods.

NPLIN uses short high-intensity laser pulses to induce nucleation in supersaturated solutions, including supersaturated protein solutions. The laser induces nucleation only in the area where the beam is focused or passes through, resulting in much fewer nuclei than would be achieved by spontaneous nucleation. In addition, the laser reduces nucleation time significantly. By controlling the number of nuclei, larger crystals result, which gives better results in x-ray structure analysis. One benefit of the invention is an improved rate of production and quality of crystals needed for determination of structures. Another benefit of the invention is a non-intrusive method for nucleating and growing crystals in that no seeds or other nucleating matter is introduced to the supersaturated solution, resulting in a cleaner and higher quality crystal.

NPLIN coupled with high-throughputmethodologies and apparatuses further improves the rate at which such higher quality and larger crystals can be formed. As discussed above, crystals often from and grow in a relatively slow process. By using high-throughput techniques, multiple crystals can be nucleated by NPLIN in sequence or in parallel, and grown contemporaneously, resulting in a higher yield of higher quality and/or larger crystals.

For example, the present method, termed high-throughput non-photochemical laser-induced nucleation (HTNPLIN), can be used for increased throughput crystallization using, for example, an array of hanging or sitting drops of supersaturated solutions containing the compounds of interest. Further, HTNPLIN can be applied to various alternative reaction vessels including, but not limited to, cuvettes, pipettes, tubes and micro-wells. Additionally, the laser can be pulsed through an aligned series or array of samples simultaneously and the beam can be split to allow the laser to be pulsed through multiple arrays at once. In addition, the arrays can be moved with time as the laser pulses to allow a large number of the samples to be exposed to the laser. HTNPLIN also can be automated to allow more efficient and more consistent laser exposure.

The method of non-photochemical laser induced nucleation of crystals as disclosed below, when combined with standard methods of crystal growth, results in fewer larger crystals of better quality. However, when further combined with high-throughput methodologies and apparatuses, more of the larger crystals of better quality can be produced in the same or less time. In addition, this method allows a reduction in the nucleation induction time so as to increase the overall rate of crystal growth. Thus, this results in an improvement in the quality and size of crystals and allows for more successful experiments per unit time. Further, the reduction of the number of crystals nucleating and growing in any given volume results in a cleaner, more efficient process.

By employing the present invention, those skilled in the art can identify and optimize appropriate conditions of power, pulse length and polarization for the laser-induced nucleation of a number of different compounds so as to provide larger and higher diffraction quality crystals compared to current methods at identical conditions. Further, the present invention results in a reduction of the nucleation induction time needed for crystals when compared with spontaneous nucleation at identical conditions. Also, this is the first time that laser-induced nucleation has been combined with high-throughput methodologies to initiate the formation of and grow multiple crystals in supersaturated solutions that will not spontaneously nucleate to form crystals.

The advantages of the present invention will become apparent to those of ordinary skill in the art when the following detailed description of the preferred embodiments is read in conjunction with the appended figure. The present invention is directed to these needs and advantages.

BRIEF DESCRIPTION OF THE DRAWING

FIG. 7 are crystallographs of lysozyme (50% S/S) crystals produced by spontaneous crystallization (FIG. 7A) and by the present invention (FIG. 7B).

FIG. 8 are crystallographs of lysozyme (hanging drops) crystals produced by spontaneous crystallization (FIG. 8A) and by the present invention (FIG. 8B).

DETAILED DESCRIPTION OF THE PREFERRED EMBODIMENTS

Figure 1:
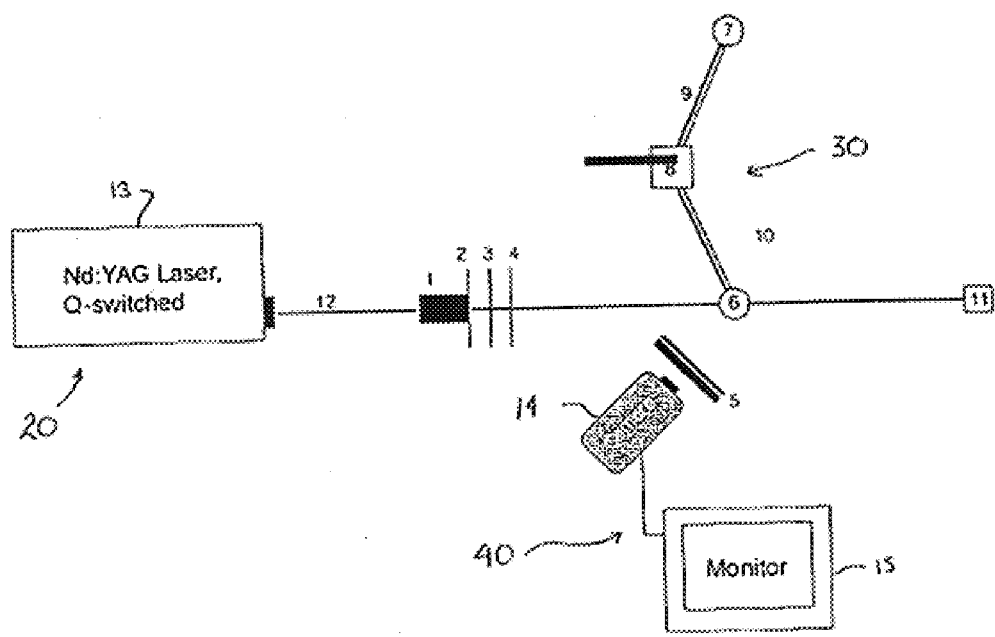
FIG. 1 is a schematic view of an example apparatus used to carry out the NPLIN method of the present invention.

The present invention produces crystals of superior quality and larger size in significantly less time than generally is required using spontaneous nucleation. The methodologies of the present invention are non-intrusive in that they do not require the introduction of foreign matter to the supersaturated solutions, resulting in a cleaner process and a cleaner final product. Current methods used to grow crystals from solutions rely on uncontrolled spontaneous nucleation that can occur anywhere in the solution or from the seeding of the solution in some manner. Uncontrolled nucleation often results in many small crystals that are not useful for structure determination. Further, such current methods often rely on the uncontrolled nucleation of crystal in batch processes resulting in the slower production of crystals. Seeded nucleation often results in crystals of dubious purity and quality.

The present invention is a high-throughput method that controls nucleation in supersaturated solutions allowing for an improvement in size and quality of crystals obtained in combination with high-throughput methodologies to increase the yield of such crystals and to reduce the time required to produce suitable crystals. In addition, the shortening of nucleation induction time and the high-throughput methodologies employed this method improves the efficiency of crystal growth by allowing more crystals to be grown in a shorter time period. The elimination of intrusive nucleation mechanisms provides for a cleaner process and a cleaner final product.

The quantity of crystals nucleated in a solution determines ultimate crystal size while solution composition, pH, supersaturation, temperature and purity control the crystal quality and structural resolution. Control of nucleation, therefore, at appropriate crystallization conditions can improve the size and quality of crystals. In addition, a method to induce nucleation on demand (or to reduce the nucleation induction time) coupled with the ability to induce such nucleation in multiple samples sequentially or concurrently (in parallel), such as the present method, can allow more successful crystal growth experiments in shorter time periods.

The present invention combines the NPLIN method developed by the inventor with high-throughput methodologies, resulting in HTNPLIN. In NPLIN, short high-intensity laser pulses induce nucleation in aged supersaturated solutions, including protein solutions. Solutions contain solute clusters, and aging the solutions allows the solute clusters to be larger. The laser induces nucleation only in the area where the beam is focused or passes through the solution or sample, resulting in much fewer nuclei than would be achieved by spontaneous nucleation in an identical solution or sample, and allowing more room for the crystal to grow. Subjecting the aged supersaturated solutions to NPLIN (and thus on the larger solute clusters) accelerates the rate-limiting organizational step of nucleation, thus reducing nucleation induction time significantly. NPLIN, therefore, has the potential to decrease the time needed for crystal growth experiments (thus increasing the number of experiments which can be done) and increasing the size and quality of crystals produced.

In HTNPLIN, NPLIN is conducted in a high-throughput setting. Many different samples can be subjected to NPLIN sequentially or concurrently, resulting in the nucleation of many crystals sequentially or concurrently. This helps to offset the characteristic of NPLIN wherein fewer crystals are nucleated per quantity of supersaturated solution.

1. Theoretical Basis and Rationale.

By its very nature, a system in a metastable state (illustrated herein by a buffered protein/precipitant solution) is bound to pass eventually into a stable state. This passage, known as the nucleation process, has a random nature. For example, in supersaturated solutions, random fluctuations of solute concentration can trigger the onset of nucleation. One of the most important characteristics of the nucleation process is its characteristic time, known as the induction time (time needed for a metastable system to relax to thermodynamic equilibrium). At a given set of conditions, the induction time is a random quantity that varies widely. This time should not be confused with the shorter time during which the metastable stationary size-distribution of subcritical clusters is established.

A pre-nucleating cluster is a complex system consisting of solute molecules and associated solvent molecules. Description of the instantaneous state of such a system requires hundreds of coordinates with the crystalline state representing a small volume in the configuration space. The laser-induced nucleation of the present invention begins the ordering process in the cluster thus allowing it to find the crystalline state more rapidly.

The laser induces nucleation in aged supersaturated solutions of substances, and the ability of the laser to induce nucleation is a strong function of both the supersaturation and the aging time. In general, the laser reduces the nucleation induction time by more than half in certain systems. For example, in lysozyme and glycine solutions, aged supersaturated solutions would nucleate spontaneously only after more than 10 days. The same solution would nucleate immediately when exposed to a short pulse of the laser if aged at least 4 days. This implies that the laser is ordering existing clusters of molecules in solution as opposed to aiding in the formation of the clusters. Further observation of such the nucleation of such solutions also indicates that the nucleation occurs only in the path of the beam through the solution. The usual result is one or possibly two crystals from the laser induced nucleation. The number of crystals that occur in spontaneously nucleated identical samples would vary over a wide range from 2 or 3 to a large number greater than 10.

2. Apparatus.

A general schematic of one apparatus used for NPLIN is shown schematically in FIG. 1. The apparatus generally comprises an optical table comprising a laser setup 20, a sample setup 30 and a monitoring setup 40. The laser setup 20 comprises a laser 13, a black tube 1, a tube aperture 2, a half wave plate 3, and a polarizer 4.

The sample setup 30 comprises a supersaturated sample 6 contained in a cuvette or other appropriate container or vessel, such as a test tube or micro-well, a magnetic stage 8, and a sample holder 9. The cuvette or other appropriate container must allow the selected wavelength of laser light to pass through without significant distortion, such that the laser pulses 12 can act upon the sample 6.

An experimental control sample 7 can be included, but is optional. For example, one suitable experimental control sample is the same supersaturated solution as used in the laser nucleation method, but is allowed to spontaneously nucleate without being subjected to laser light. The sample holder merely is a structure having the ability to hold the sample 6 and the experimental control sample 7 during the process.

The monitoring setup 40 also is optional and comprises a camera 14 coupled to a monitor 15 allows the user to monitor the process. A converging lens and an IR filter 5 magnifies the sample image and protects the camera 14 from stray or scattered light, respectively. In general, the monitoring setup 40 is constructed merely to monitor the process and can be configured as necessary or desired for optimum monitoring without undue experimentation by one of ordinary skill in the art.

An illustrative laser for inducing nucleation is a switched Nd:YAG laser oscillator-amplifier system operating at 1064 nm and having a tube aperture 2 of d=1.981 mm, on a micrometer stage. The half wave plate 3 was keyed to the laser 13 wavelength and for the experimental laser wavelength of 1064 nm, the half wave plate is a 1064 nm half wave plate. A beam stopper 11 was used to prevent the laser pulses 12 from exiting the system and is for safety reasons. This particular laser 13 produces a 10-pps train of 9-ns laser pulses 12. A portion of the annular beam 12 from the laser 13 with approximately constant intensity is selected by passing the beam 12 though an m-mm diameter circular aperture 2 and then through the test tube or cuvette containing the supersaturated sample solution 6.

The video camera 14 of the monitoring setup 40 is set up to record any changes in the state of the sample 6 during and after laser illumination. The IR filter 5 is placed in front of the camera 14 lens to prevent damage from scattered light. The convex (convergent) lens is placed in front of the camera 14 to magnify the image.

The use of cuvettes or Pyrex® sample tubes for solution samples 6 particularly is suited to situations in which supersaturation is generated by cooling. This normally is accomplished either by making the original sample 6 as a saturated solution at higher temperature and letting the sample 6 cool to room temperature for an experiment or by using a jacketed cuvette in which the sample 6 can be cooled and the temperature controlled. Hanging drop apparatus and micro-wells also have been found to be suitable for carrying out NPLIN on the aged supersaturated solutions.

It should be recognized by those of ordinary skill in the art that the experimental apparatus and setup previously described can be varied and optimized without undue experimentation, as the primary focus of this invention is the ability to nucleate a protein solution with laser light in a high throughput system. Further, the experimental apparatus and setup previously described can be used in conjunction with many known crystal growing techniques and apparatuses, as the experimental apparatus and setup, as well as the laser nucleation process itself, are for the initiation of the crystallization, and not necessarily for the subsequent crystal growth period. Other laser nucleation setups are contemplated.

Figure 3:
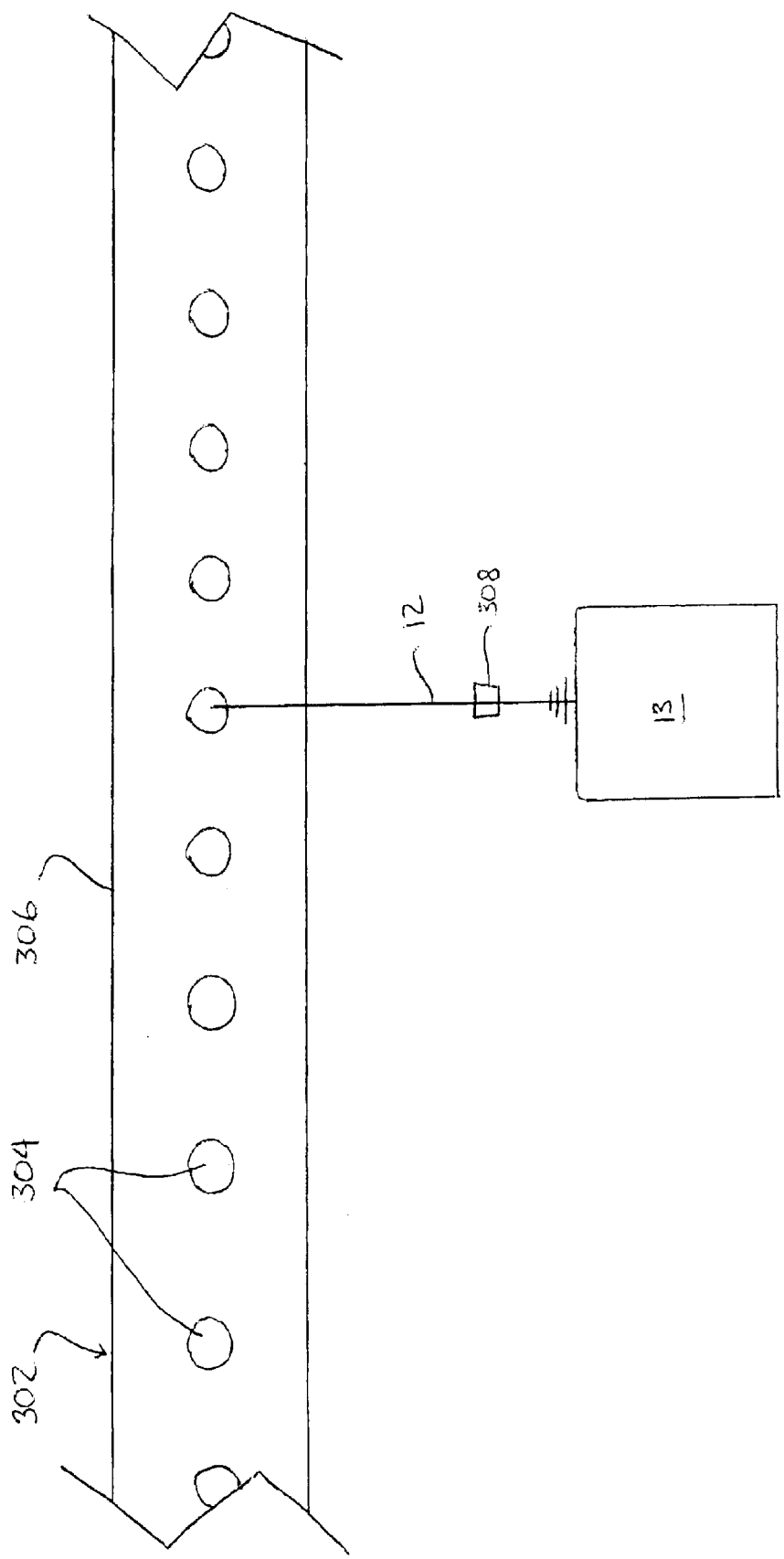
FIG. 3 is a schematic view of an example high-throughput hanging drop apparatus used to carry out the HTNPLIN method of the present invention.
Figure 4:
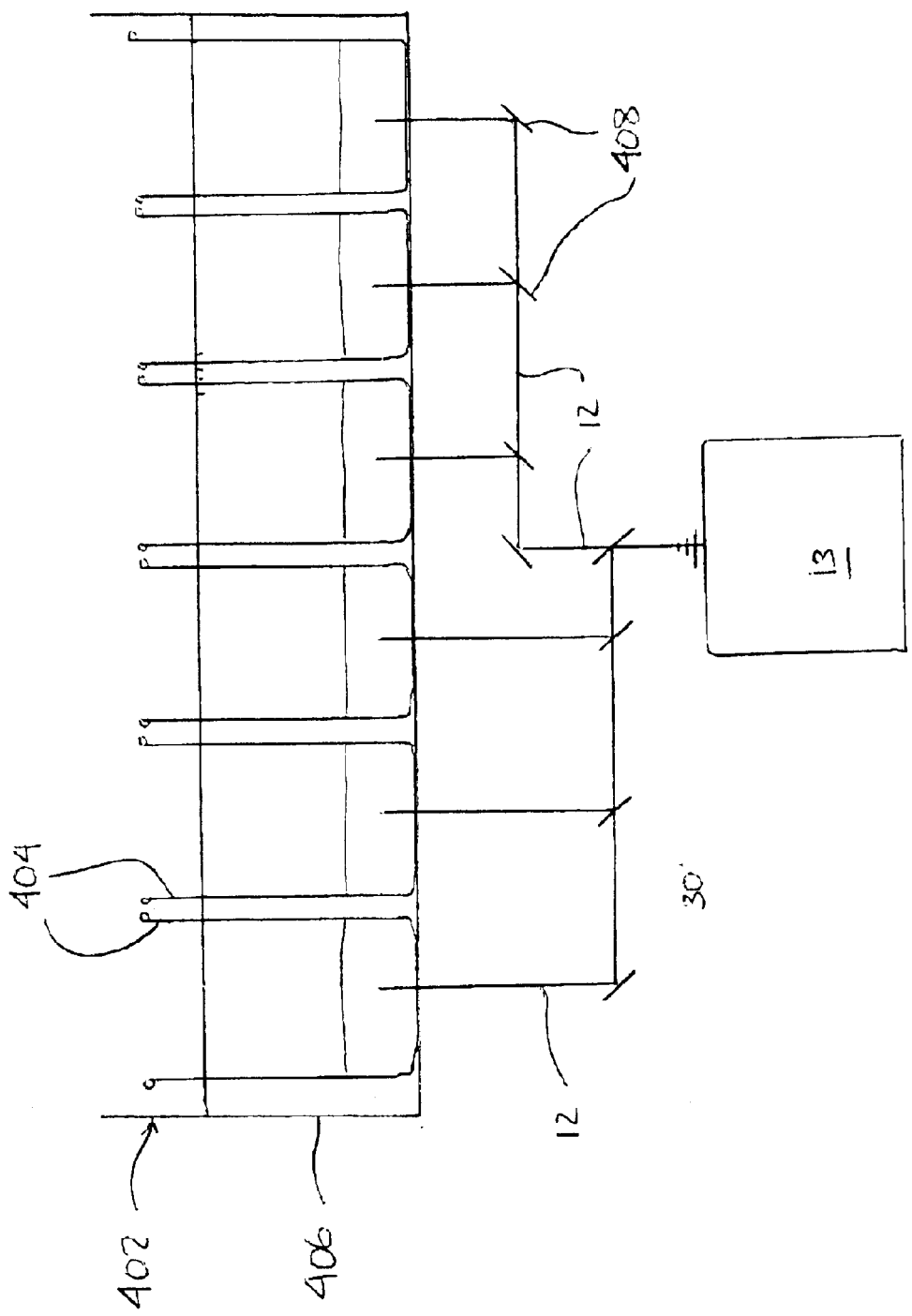
FIG. 4 is a schematic view of an example high-throughput tube apparatus used to carry out the HTNPLIN method of the present invention.
Figure 5:
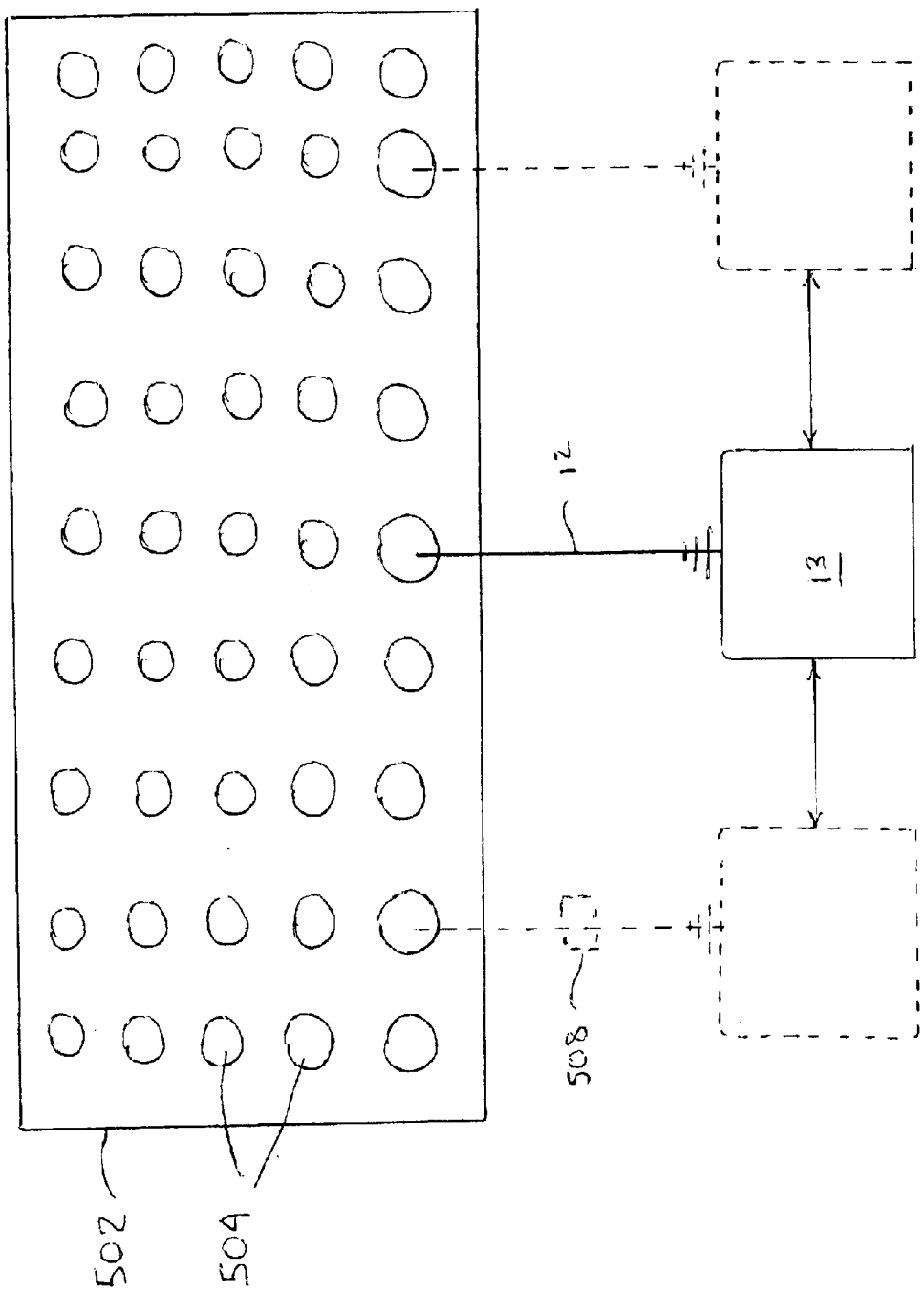
FIG. 5 is a schematic view of an example high-throughput micro-well array apparatus used to carry out the HTNPLIN method of the present invention.

FIGS. 3 through 5 are schematics of exemplary systems for HTNPLIN. Specifically, FIG. 3 is a schematic view of an example high-throughput hanging drop apparatus, FIG. 4 is a schematic view of an example high-throughput tube apparatus, and FIG. 5 is a schematic view of an example high-throughput micro-well array apparatus that can be used to carry out the HTNPLIN method of the present invention. Other high-throughput apparatuses also can be used to carry out HTNPLIN and the present invention is not meant to be limited to the three exemplary embodiments.

Referring now to FIG. 3, a sequential array 302 of hanging drops 304 are aligned on elongated plate 306. Hanging drops 304 are the supersaturated solution from which the crystals will form. Generally, hanging drops 304 are subjected to NPLIN, resulting in crystal formation. Specifically, hanging drops 304 can be subjected to HTNPLIN in several different methods, several of which will be discussed below for illustrative purposes only. A first illustrative method is for elongated plate 306 to remain motionless and for laser 13 to be moved or rotated so as to impinge sequentially upon each hanging drop 304. A second illustrative method is for both elongated plate 306 and laser 13 to remain motionless and for beam 12 to be directed sequentially to impinge upon each hanging drop 304 by mirror or lens 308. A third illustrative method is for both elongated plate 306 and laser 13 to remain motionless and for beam 12 to be directed concurrently to impinge upon two or more hanging drops 304 by one or more mirror or lens 308. A fourth illustrative method is for laser 13 to remain motionless and for elongated plate 306 to be moved past beam 12 such that each hanging drop 304 passes sequentially by beam 12.

Referring now to FIG. 4, a sequential array 402 of vessels 404, such as cuvettes, pipettes or test tubes, are aligned on rack 406. Vessels 404 contain the supersaturated solution from which the crystals will form. Generally, the supersaturated solution within vessels 404 is subjected to NPLIN, resulting in crystal formation. Specifically, similarly to the method disclosed previously, the supersaturated solution within vessels 404 can be subjected to HTNPLIN in several different methods, several of which will be discussed below for illustrative purposes only. A first illustrative method is for rack 406 to remain motionless and for laser 13 to be moved or rotated so as to impinge sequentially upon the supersaturated solution within each vessel 404. A second illustrative method is for both rack 406 and laser 13 to remain motionless and for beam 12 to be directed sequentially to impinge upon the supersaturated solution within each vessel 404 by mirror or lens 408. A third illustrative method is for both rack 406 and laser 13 to remain motionless and for beam 12 to be directed concurrently to impinge upon the supersaturated solution within two or more vessels 404 by one or more mirror or lens 408. A fourth illustrative method is for laser 13 to remain motionless and for rack 406 to be moved past beam 12 such that each vessel 404 containing supersaturated solution passes sequentially by beam 12.

Referring now to FIG. 5, a micro-well array 502 of individual micro-wells 504 is shown. Micro-wells 504 contain the supersaturated solution from which the crystals will form. Generally, the supersaturated solution within micro-wells 504 is subjected to NPLIN, resulting in crystal formation. Specifically, similarly to the method disclosed previously, the supersaturated solution within micro-wells 504 can be subjected to HTNPLIN in several different methods, several of which will be discussed below for illustrative purposes only. A first illustrative method is for array 502 to remain motionless and for laser 13 to be moved or rotated so as to impinge sequentially upon the supersaturated solution within each micro-well 504. A second illustrative method is for both array 502 and laser 13 to remain motionless and for beam 12 to be directed sequentially to impinge upon the supersaturated solution within each micro-well 504 by mirror or lens 508. A third illustrative method is for both array 502 and laser 13 to remain motionless and for beam 12 to be directed concurrently to impinge upon the supersaturated solution within two or more micro-wells 504 by one or more mirror or lens 508. A fourth illustrative method is for laser 13 to remain motionless and for array 502 to be moved past beam 12 such that each micro-well 504 containing supersaturated solution passes sequentially by beam 12.

When using a vessel-based array, such as vessels 404 and micro-wells 504, the crystals can be nucleated within the vessel, allowed to grow within the vessel, and then characterized and screened within the vessel. Characterization and screening can be accomplished using known techniques.

3. Method.

In crystal growth processes supersaturation often is generated by evaporation of the solvent. This is especially true in protein crystal growth processes. In the classical "hanging drop" method, a drop of the buffered protein/precipitant solutions is suspended from the underside of a sealed microscope cover slip, which then is placed over a small well containing a milliliter reservoir of the precipitant solution. The initial conditions are such that the solvent diffuses from the protein solution towards the reservoir solution making the solution supersaturated. Crystallization then was initiated spontaneously or by any of the known methods. The resulting crystals were small in size and quantity, and not of excellent crystallinity.

NPLIN experiments were conducted by preparing solutions of the compound of interest in clean containers or reaction vessels of a known concentration at an elevated temperature and then supersaturating the solutions by various techniques. For example, reaction vessels such as tubes (cuvettes, pipettes, and test tubes) the solutions were supersaturated by cooling the solutions slowly to room temperature, for reaction vessels such as drops (hanging drops and sitting drops) the solutions were supersaturated by allowing the solvent to evaporate from the solution along with cooling the solution to room temperature if necessary, and for reaction vessels such as micro-wells the solutions were supersaturated by cooling and/or evaporation. For experiments conducted using the hanging drop technique or the similar sitting drop technique and sometimes using micro-wells where the solution has a greater exposure to the ambient, the solvent actually continues to evaporate with time, resulting in an increase in supersaturation with time. For the purposes of this disclosure, the term vessel is meant to include all types and manner of suitable containers such as, but not limited to, test tubes, pipettes, cuvettes, hanging drops, micro-wells, and the like. The sample solutions were then supersaturated and metastable. Samples then were divided into a control group and a group to be irradiated by the laser.

Samples were aged for selected periods ranging from minutes to periods of many days. Aging involves letting the metastable supersaturated solutions sit for periods of time to allow the formation of molecular clusters in the solution that are close to the critical size. In general, the aging process can be divided into four categories. The first category includes aging the samples for up to 4 hours, and preferably between 1 and 4 hours, and more preferably between 2 and 4 hours. The second category includes aging the samples for between 4 hours and 1 day. The third category includes aging the samples for between 1 day and 4 days and aging the samples for between 2 days and 4 days. The fourth category includes aging the samples for longer than 4 days. For experiments conducted using the hanging drop technique or the similar sitting drop technique, because the solvent actually continues to evaporate with time as disclosed above, there is an increase in supersaturation during the aging period.

The supersaturated solutions then, preferably prior to any spontaneous nucleation or other nucleating event, were subjected to pulses from the laser. As discussed in more detail subsequently, crystals nucleated along the path of the laser beam through the supersaturated solution. It was found that in the absence of spontaneous nucleation and other nucleating events, crystals only nucleated along the path of the laser beam through the solution. It was further found that a relatively small number of crystals nucleated when compared to conventional spontaneous nucleation processes, and that the crystals that did nucleate were able to grow into larger crystals of better crystallinity when compared to conventional spontaneous nucleation processes.

Similarly, HTNPLIN can be conducted on series of hanging drops, one- and multi-dimensional arrays of vessels, and one- and multi-dimensional arrays of micro-wells. Crystals nucleate in the laser beam path, and can grow within the drop, vessel or micro-well. As fewer crystals nucleate within each drop, vessel or micro-well, larger crystals of higher quantity grow. The crystals then can be farmed from each drop, vessel or micro-well for use, either before or after characterization and/or screening.

4. Reactants.

To illustrate the present method, proteins in buffer solutions were used. A solution of the selected protein was prepared in a precipitant and a buffer. Solutions were prepared initially containing a predetermined percentage of the selected protein and precipitant. These solutions then were supersaturated to known levels. The samples then were divided into a control group and a group to be exposed to the laser and aged. Following are general examples of such solutions.

A solution of lysozyme was prepared with sodium chloride and a buffer (0.1M sodium acetate) at pH of 4.0 and a temperature of 25 C. Solutions were prepared initially containing 4% lysozyme and 1% sodium chloride. These solutions then were supersaturated to known levels of 30%, 40%, and 50% by evaporation of water. The samples then were divided into a control group and a group to be exposed to the laser and aged. Similar solutions of bovine insulin and elastase (porcine pancreatic) also were made. These proteins, and especially lysozyme, were selected as illustrative examples because they provide good general representations of proteins, and the results can be expounded to the class of proteins as a whole. For example, those of ordinary skill in the art commonly use lysozyme systems in protein crystallization experiments. Lysozyme systems can easily translate to other systems using other proteins, precipitants, and buffers.

The method translates well to other protein solutions. Example proteins that can be used include, but are not limited to, serine proteases, pepsin, amylase, lipase, carboxypeptidase, lysozyme, concanavalin A (from jack bean), concanavalin B (from jack bean), canavalin, urease, abrin, ricin, pea lectin, emulsin, edestin, hemoglobin, myoglobin, rubredoxin, catalase, peroxidase, ferritin, ceruloplasm, carbonic anhydrase, alcohol dehydrogenase, papain, phytocyanin, tropomyosin, yeast phenylalanine tRNA, insulin, immunoglobulin, thermosylin, serum albumin, beta-lactamase, creatine kinase, alpha-lactalbumin, and aldolase.

Example solvents or precipitants that can be used include, but are not limited to, water, MES,2-(N-morpholino)-ethanesulfonic acid, ammonium acetate, glycerol, spermine, cacodylate, potassium chloride, ethanol, phosphate, HEPES, potassium phosphate, sodium citrate, sodium phosphate, calcium chloride, EDTA, dithiothreitol, sodium acetate, sodium cacodylate, magnesium chloride, sodium azide, 2-methyl-2,4-pentanediol, sodium chloride, tris-HCl, ammonium sulfate, PEG (200–35000) (with PEG 4000, PEG 6000 and PEG 8000 being used most often out of the PEGs).

Example buffers that can be used include, but are not limited to, acetate buffer, citrate buffer, phosphate buffer, sodium acetate buffer, sodium phosphate buffer, and potassium phosphate buffer.

Those of ordinary skill in the art can select combinations of a protein, precipitant and buffer for use in the method, either from the examples given previously or other proteins, precipitants and buffers, without undue experimentation. In fact, varying the proteins, precipitants and buffers, as well as the process parameters, will allow the nucleation of may different types of protein crystals, which then can be characterized and used for subsequent methodologies, such as X-ray studies, pharmaceuticals and experiments.

The method also translates to other compounds in solution, and is not limited to protein solutions. Generally, any compound that can crystallize can be subjected to HTNPLIN.

5. Procedure.

The general procedure for the method simply is to create a supersaturated solution of a compound of interest and subject the supersaturated solution to laser light for a period sufficient to initiate nucleation of the protein crystals. The crystals then are grown using any of the known crystal growth methods.

Figure 2:
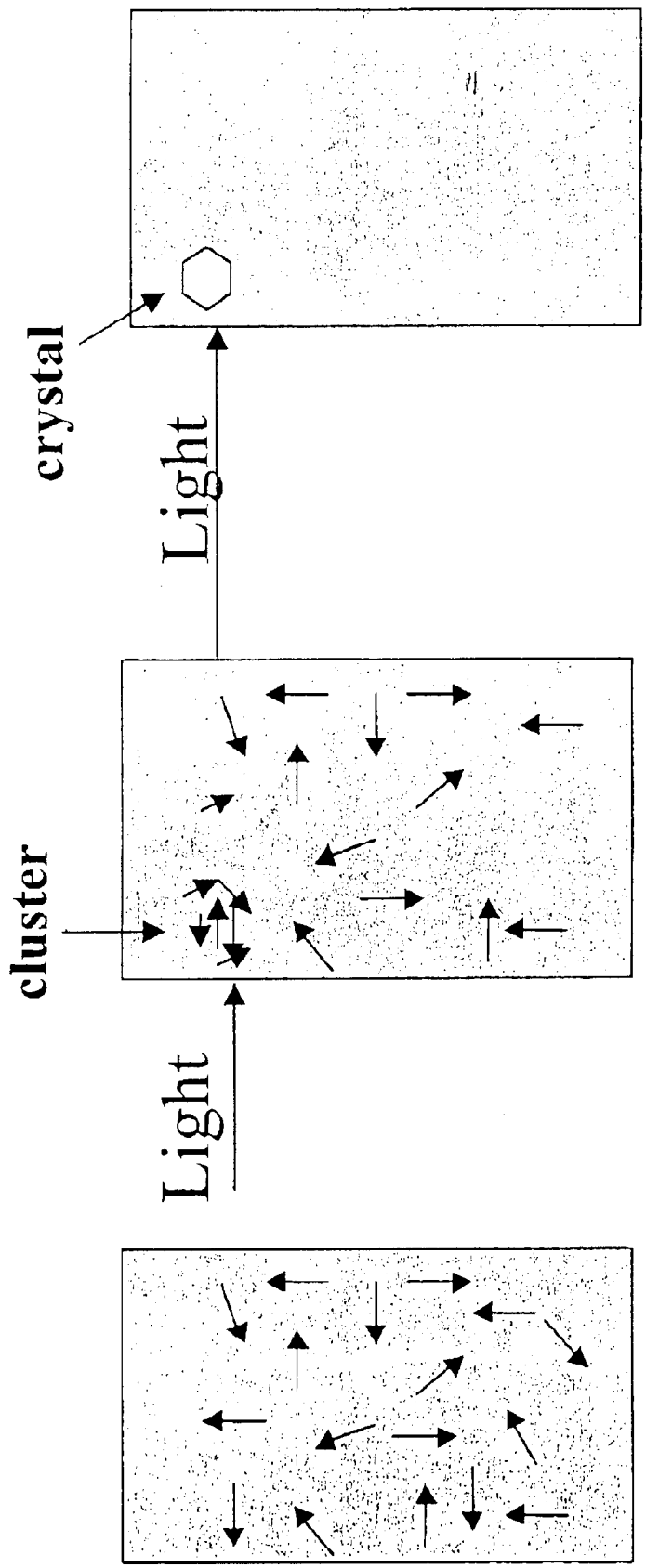
FIG. 2 is a schematic view of the positional nucleation achieved by the NPLIN method of the present invention.

FIG. 2 represents a supersaturated solution being subjected to the present method. This supersaturated solution can be contained in the hanging drop 304 of FIG. 3, the vessel 404 of FIG. 4 or the micro-well 504 of FIG. 5. The supersaturated solution as shown in the first (left) box is generally illustrative of supersaturated solutions and show solute particles represented by arrows. Aged supersaturated solutions as shown in the second (center) box generally have clusters of solute particles. The aged supersaturated solution is subjected to light, in the form of a pulsed laser beam, as shown in the second (center) box. The laser light acts upon the solute clusters to induce nucleation of crystals, as shown in the third (right) box. Nucleation only occurs where the laser beam is focused or passes through the supersaturated solution, resulting in fewer nuclei, which in turn results in larger crystals.

In FIG. 3, the supersaturated solution is impinged by the laser beam 12 while hanging from the elongated plate 306, nucleation is initiated, and the crystal is allowed to grow as is known in the art. Many hanging drops 304 can be impinged sequentially or contemporaneously. In FIG. 4, the supersaturated solution is impinged by the laser beam 12 while contained in the vessel 404 in the rack 406, nucleation is initiated, and the crystal is allowed to grow as is known in the art. Many vessels 404 can be impinged sequentially or contemporaneously. In FIG. 5, the supersaturated solution is impinged by the laser beam 12 while contained in the micro-well 504 in the array 502, nucleation is initiated, and the crystal is allowed to grow as is known in the art. Many micro-wells 504 can be impinged sequentially or contemporaneously.

In more detail, one example procedure that has provided excellent results is to create identical samples for the supersaturated sample and the experimental control sample as disclosed above. The experimental control sample is allowed to spontaneously nucleate without outside influence, such as by the laser, while the supersaturated sample is subjected to laser light. Specifically, the selected laser, such as the Nd:YAG Q-switched laser shown in FIG. 1 and described above, is directed at the supersaturated sample.

In the apparatus shown in FIG. 1, laser pulses emitted from the laser pass through the black tube 1, the aperture 2, and the half wave plate 3 to enable the rotation of the plane of polarization. The plane of polarization is selected to create a coherent beam. The polarization can be either linear or circular. The polarized laser pulses 12 then pass through polarizer 4 to eliminate light not polarized in the desired or selected direction. A calcite prism polarizer 4 is included to eliminate light not polarized in the desired direction. The laser 13 oscillator and amplifier typically are set at maximum power. With the example laser, the estimated peak intensities incident on the supersaturated solution are approximately 0.7 GW/cm$^2$. With the oscillator alone, peak intensities are about on third of this value.

The laser light pulses preferably at between 1 pulse and 100 pulses per hour, with the supersaturated solution being subjected to the laser light for a period of between 0.01 second and 60 seconds. The selection of both the number of pulses per hour and the length of time the supersaturated solution is subjected to the laser light are variable, depending on the type of solution being subjected to the process, and the desired result. One of ordinary skill in the art can select the desired pulse rate and time without undue experimentation.

The now polarized laser pulses are directed at and pass through the supersaturated sample. Nucleation of the crystals occurs only in the path of the laser beam through the supersaturated sample solution. Generally, it has been found that only one to three crystals nucleate, although it is possible for more than three crystals to nucleate. When compared to the experimental control sample, in which approximately 10 or more crystals spontaneously nucleate, the crystals that nucleate due to the laser are fewer and nucleate more quickly. Once the crystals nucleate, they can be grown using any of the known crystal growth methods.

For the procedure as applied generally to supersaturated solutions and specifically to protein solutions, the supersaturated solution preferably has a pH of between 2 and 12, and is maintained at a temperature of between 0° C. and 80° C. Further, the preferred supersaturated solution has between 0.1% and 50% of the compound of interest by weight. Again, the selection of the pH, the temperature, and the percent protein composition of the supersaturated solution are variable, depending on the type of solution being subjected to the process, and the desired result. One of ordinary skill in the art can select the desired pH, temperature and percent compound of interest without undue experimentation.

6. Results.

Experimental results were most successful with solutions of a supersaturation of approximately 100%. These solutions would nucleate spontaneously in periods of 4–7 days and could be nucleated by the laser after 2 days. Laser induced nucleation normally produced 1–3 crystals where spontaneous nucleation produced large numbers (greater then 10) of crystals. The laser-induced crystals therefore were significantly larger then those obtained by spontaneous nucleation. Experiments with lower supersaturations were less successful because of the very long aging times required.

The results of the method indicate the importance in optimizing the supersaturation so as to reduce the aging time. It also suggests that the laser works by acting on existing large clusters of molecules rather than by forming such clusters since the solutions must be aged for the laser to induce nucleation. The results demonstrate that laser-induced nucleation can provide a method to induce nucleation in solutions and to control the number of nuclei formed.

Table 1 illustrates a comparison between spontaneous crystallization and NPLIN induced crystallization of example crystals. As can be seen, the use of NPLIN results in a reduction in induction time when NPLIN is used.

TABLE I

| System | Technique | S/S (%) | Induction Time Spontaneous | NPLIN | Reduction |
|---|---|---|---|---|---|
| Lysozyme | Batch | 30, 40, 50 | 72 hr | 24–36 hr | 2–3× |
| Lysozyme | Hanging Drop | N/A | 16 hr | 6 hr | 2.5× |
| Bovine Insulin | Batch | N/A | 72–84 hr | 24–36 hr | 2–3× |
| Elastase | Batch | N/A | 48–72 hr | 24–36 hr | 2–3× |
| Urea | Batch | 30, 40, 50 | Weeks | 4–6 days | 2–3× |
| L-alanine | Batch | 30, 40, 50 | Weeks to Months | 2–4 days | 2–5× |
| Glycine | Batch | 30, 40, 50 | Weeks | 4–7 days | 2–3× |
| Glycyl-glycine | Batch | 25, 30 | 96 hr | 24–36 hr | 2–4× |
| Spiperone | Batch | 40 | 48 hr | 24 hr | 2× |
| Diphenahydramine hydrochloride | Batch | 30, 40, 50 | 10–14 days | 48–72 hr | 2–4× |

Table 2 illustrates a comparison between the crystallinity of example protein crystals produced by spontaneous crystallization and by NPLIN. As can be seen, the crystallinity is identical. The crystal analysis shows no loss of crystallinity with the use of NPLIN.

TABLE 2

| Parameter | Spontaneous | NPLIN |
|---|---|---|
| A (Å) | 78 | 78 |
| B (Å) | 78 | 78 |
| C (Å) | 37 | 37 |
| α, β, (°) | 90 | 90 |
| Space group | P4(3)2(1)2 | P4(3)2(1)2 |
| $D^2$ (Å) | <1.4 | <1.4 |

Table 3 illustrates a comparison between spontaneously induced crystals and NPLIN induced crystal for the crystals shown in FIGS. 6 through 10. FIGS. 6 through 10 illustrate that crystals nucleated and grown according to the present invention grow larger than their spontaneously induced counterparts.

TABLE 3

| Protein | Spontaneously Induced Crystal Size (microns) | NPLIN Induced Crystal Size (microns |
|---|---|---|
| Lysozyme (30% S/S) | 448 × 307 | 1280 × 1290 |
| Lysozyme (50% S/S) | 753 × 817 | 1201 × 957 |
|  | 436 × 204 |  |
| Lysozyme (Hanging drop) | 728 × 681 | 1512 × 1645 |
|  | 413 × 336 |  |
| Bovine Insulin | 62 × 65 | 67 × 75 |
|  |  | 81 × 162 |
| Elastase | 29 × 20 | 35 × 48 |
|  |  | 51 × 29 |

Figure 6A:
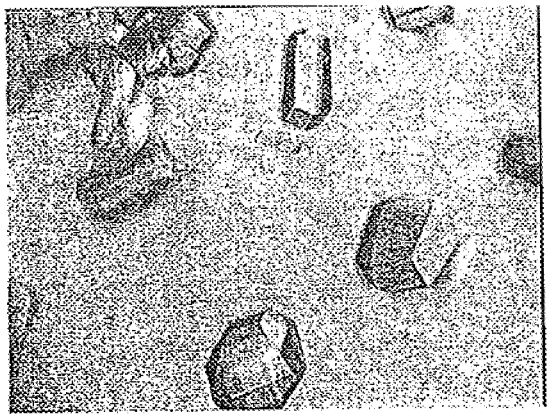
FIG. 6 are crystallographs of lysozyme (30% S/S) crystals produced by spontaneous crystallization (FIG. 6A) and by the present invention (FIG. 6B).
Figure 6B:

FIGS. 6A and 6B are photographs taken through an optical microscope (photomicrographs) of lysozyme (30% S/S) crystals produced by spontaneous crystallization (FIG. 6A) and by the present invention (FIG. 6B). The spontaneously induced lysozyme (30% S/S) crystal measures 448 by 307 microns, while the NPLIN induced crystal measures 1280 by 1290 microns. FIGS. 7A and 7B are photomicrographs of lysozyme (50% S/S) crystals produced by spontaneous crystallization (FIG. 7A) and by the present invention (FIG. 7B). One spontaneously induced lysozyme (50% S/S) crystal measures 753 by 817 microns and another measures 436 by 204 microns, while the NPLIN induced crystal measures 1201 by 957 microns. FIG. 8 are photomicrographs of lysozyme (hanging drops) crystals produced by spontaneous crystallization (FIG. 8A) and by the present invention (FIG. 8B). One spontaneously induced lysozyme (hanging drop) crystal measures 728 by 681 microns and another measures 413 by 336 microns, while the NPLIN induced crystal measures 1512 by 1645 microns.

Figure 9A:
FIG. 9 are crystallographs of bovine insulin crystals produced by spontaneous crystallization (FIG. 9A) and by the present invention (FIG. 9B).
Figure 9B:
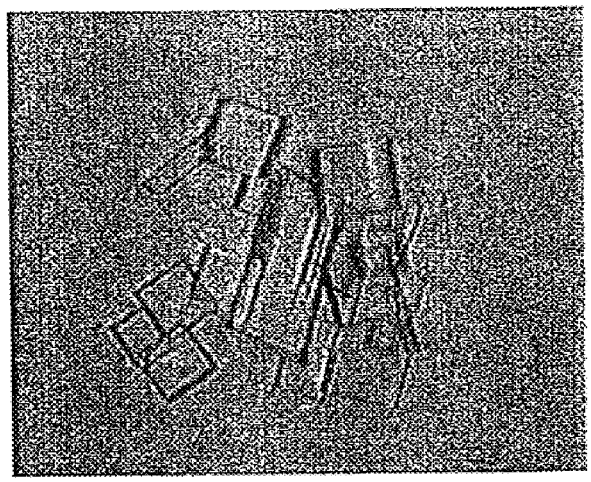
Figure 10A:
FIG. 10 are crystallographs of elastase (porcine pancreatic) crystals produced by spontaneous crystallization (FIG. 10A) and by the present invention (FIG. 10B).
Figure 10B:
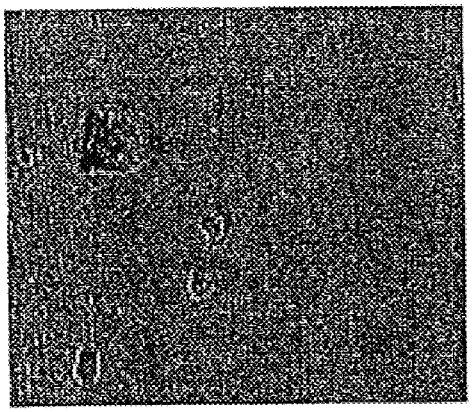

FIGS. 9A and 9B are photomicrographs of bovine insulin crystals produced by spontaneous crystallization (FIG. 9A) and by the present invention (FIG. 9B). The spontaneously induced bovine insulin crystal measures 62 by 65 microns, while two of the NPLIN induced crystal measure 67 by 75 microns and 81 by 162 microns. FIGS. 10A and 10B are photomicrographs of elastase (porcine pancreatic) crystals produced by spontaneous crystallization (FIG. 10A) and by the present invention (FIG. 10B). The spontaneously induced bovine insulin crystal measures 29 by 20 microns, while two of the NPLIN induced crystal measure 35 by 48 microns and 51 by 29 microns.

7. Additional Applications of the Method.

In addition to providing nucleation in general, the use of a laser can provide for positional nucleation. Currently, in spontaneous nucleation processes, crystals nucleate at random within the solution. Similarly, in seeded nucleation processes, crystals nucleate at the seeds, which can travel anywhere throughputthe solution. With laser nucleation, the laser beam can be directed precisely through the solution. Thus, the laser beam can be directed through the heart of the solution (such as, for example, through the thickest part of the drop in hanging drop processes or in the center of the vessel or micro-well in vessel-based processes) or through a certain part of the solution if it is desired to nucleate at a certain site within the solution.

Also, as discussed above, by using laser nucleation, the nucleation process can be started earlier (hours rather than days after supersaturating the solution). Thus, rather than having to wait for the spontaneous nucleation to begin, crystals can be nucleated on a relatively set schedule. In this manner, crystals can be grown timelier and as necessary.

Based on the known phenomena that if fewer crystals nucleate, larger crystals grow, the use of laser nucleation can allow the growth of larger crystals. Because the supersaturated protein solution is nucleated by the laser prior to the spontaneous nucleation time event, spontaneous nucleation is reduced or eliminated until after the desired protein crystals have been nucleated and grown. As a result, a positive trichotomy occurs. First, fewer, but larger crystals are grown using laser nucleation. Second, high throughput allows a greater number of crystals to be grown in the same or a shorter period of time. Third, HTNPLIN is a cleaner and more successful methodology for producing crystals than the prior art.

The above detailed description of the preferred embodiments, including the example methods, and the appended figures are for illustrative purposes only and are not intended to limit the scope and spirit of the invention, and its equivalents, as defined by the appended claims. One skilled in the art will recognize that many variations can be made to the invention disclosed in this specification without departing from the scope and spirit of the invention.

What is claimed is:

1. A high throughput non-photochemical method of inducing nucleation of crystals comprising:
   a. preparing a supersaturated solution of a compound;
   b. placing a preselected amount of the supersaturated solution in a plurality of reaction vessels;
   c. allowing the supersaturated solution to age for an aging period;
   d. selecting a wavelength, power and polarization state of laser light necessary to induce nucleation of crystals from the aged supersaturated solution; and
   e. subjecting the aged supersaturated solution in the plurality of reaction vessels to the laser light for a period of time so as to induce nucleation of crystals by using a high-throughput technique resulting in the high throughput non-photochemical laser induced nucleation of the crystals within the reaction vessels.

2. The method as claimed in claim 1, wherein the high-throughput technique is to subject the preselected amount of the supersaturated solution in the plurality of reaction vessels to the laser light in a rapid sequential procedure resulting in the high throughput non-photochemical laser induced nucleation of the crystals within the reaction vessels.

3. The method as claimed in claim 1, wherein the high-throughout technique is to subject the preselected amount of the supersaturated solution in the plurality of reaction vessels to the laser light concurrently resulting in the high throughput non-photochemical laser induced nucleation of the crystals within the reaction vessels.

4. The method as claimed in claim 1, wherein the reaction vessels are selected from the group consisting of test tubes, pipettes, cuvettes, hanging drops, micro-wells, combinations thereof, and arrays thereof.

5. The method as claimed in claim 4, wherein the aged supersaturated solution is subjected to the laser light until at least a portion of the compound in the aged supersaturated solution has crystallized into the crystals.

6. The method as claimed in claim 5, wherein the laser light is at such a wavelength that the aged supersaturated solution will not absorb the laser light.

7. The method as claimed in claim 5, wherein the laser light is pulsed.

8. The method as claimed in claim 7, wherein the laser light pulses at between 1 pulse and 100 pulses per second.

9. The method as claimed in claim 8, wherein the laser light pulses at approximately 10 pulses per second.

10. The method as claimed in claim 9, wherein the aged supersaturated solution is subjected to the laser light for a period of between 0.01 second and 60 seconds.

11. The method as claimed in claim 10, wherein the laser light is in the near infrared range.

12. The method as claimed in claim 4, wherein the aged supersaturated solution comprises the compound of interest in a solvent.

13. The method as claimed in claim 4, wherein the aged supersaturated solution further comprises a buffer.

14. The method as claimed in claim 13, wherein the buffer is selected from the group consisting of acetate buffer, citrate buffer, phosphate buffer, sodium acetate buffer, sodium phosphate buffer, and potassium phosphate buffer.

15. The method as claimed in claim 4, wherein the aged supersaturated solution has a pH of between 2 and 12.

16. The method as claimed in claim 15, wherein the aged supersaturated solution has a pH of approximately 4.0.

17. The method as claimed in claim 11, wherein the aged supersaturated solution further comprises a precipitant.

18. The method as claimed in claim 17, wherein the precipitant is selected from the group consisting of MES,2-(N-morpholino)-ethanesulfonic acid, ammonium acetate, glycerol, spermine, cacodylate, potassium chloride, ethanol, phosphate, HEPES, potassium phosphate, sodium citrate, sodium phosphate, calcium chloride, EDTA, dithiothreitol, sodium acetate, sodium cacodylate, magnesium chloride, sodium azide, 2-methyl-2,4-pentanediol, sodium chloride, tris-HCl, ammonium sulfate, PEG (200–35000) (with PEG 4000, PEG 6000 and PEG 8000 being used most often out of the PEGs).

19. The method as claimed in claim 12, wherein the aged supersaturated solution is maintained at a temperature up to the boiling point of the solvent.

20. The method as claimed in claim 19, wherein the aged supersaturated solution is maintained at a temperature of approximately 25° C.

21. The method as claimed in claim 4, wherein the aged supersaturated solution comprises between 0.1% and 50% protein.

22. The method as claimed in claim 4, wherein the crystals are allowed to grow for a selected period of time, whereby the crystals grow to a size larger than those that would grow from an identical supersaturated solution that is allowed to spontaneously nucleate in the absence of the laser light.

23. The method as claimed in claim 12, wherein the supersaturated solution of the compound is produced by mixing the compound in the solvent and cooling the resultant mixture.

24. The method as claimed in claim 12, wherein the supersaturated solution of the compound is produced by mixing the compound in the solvent and allowing a portion of the solvent to evaporate over a period of time.

25. The method as claimed in claim 24, wherein the period of time is the aging period.

26. The method as claimed in claim 1, wherein the aging period is up to 7 days.

27. The method as claimed in claim 1, wherein the aging period is between 1 hour and 4 hours.

28. The method as claimed in claim 1, wherein the aging period is between 4 hours and 1 day.

29. The method as claimed in claim 1, wherein the aging period is between 1 day and 4 days.

30. The method as claimed in claim 1, wherein the aging period is between 2 days and 4 days.

31. The method as claimed in claim 1, wherein the aging period is between 4 days and 7 days.

32. A high throughput non-photochemical method of inducing nucleation of crystals comprising:
   a. preparing a supersaturated solution of a compound;
   b. placing a preselected amount of the supersaturated solution in a plurality of reaction vessels;

c. allowing the supersaturated solution to age for a period of at least 4 hours;

d. selecting a wavelength, power and polarization state of laser light necessary to induce nucleation of crystals from the aged supersaturated solution, wherein the laser light is at such a wavelength that the aged supersaturated solution will not absorb the laser light; and e. subjecting the aged supersaturated solution in the plurality of reaction vessels to the laser light for a period of time so as to induce nucleation of the crystals until at least a portion of the compound in the aged supersaturated solution has crystallized into the crystals, wherein the preselected amount of the supersaturated solution in the plurality of reaction vessels is subjected to the laser light using high-throughput techniques resulting in the high throughput non-photochemical laser induced nucleation of the crystals within the reaction vessels.

33. The method as claimed in claim 32, wherein the reaction vessels are selected from the group consisting of test tubes, pipettes, cuvettes, hanging drops, micro-wells, combinations thereof, and arrays thereof.

34. The method as claimed in claim 33, wherein the aged supersaturated solution is subjected to the laser light for a period of between 0.01 second and 60 seconds.

35. The method as claimed in claim 34, wherein the laser light is in the near infrared range.

36. The method as claimed in claim 35, wherein the laser light is pulsed.

37. The method as claimed in claim 36, wherein the laser light pulses at between 1 pulse and 100 pulses per second.

38. The method as claimed in claim 37, wherein the laser light pulses at approximately 10 pulses per second.

39. The method as claimed in claim 38, wherein the aged supersaturated solution comprises the compound of interest in a solvent.

40. The method as claimed in claim 39, wherein the aged supersaturated solution further comprises a buffer.

41. The method as claimed in claim 40, wherein the buffer is selected from the group consisting of acetate buffer, citrate buffer, phosphate buffer, sodium acetate buffer, sodium phosphate buffer, and potassium phosphate buffer.

42. The method as claimed in claim 40, wherein the aged supersaturated solution further comprises a precipitant.

43. The method as claimed in claim 42, wherein the precipitant is selected from the group consisting of MES,2-(N-morpholino)-ethanesulfonic acid, ammonium acetate, glycerol, spermine, cacodylate, potassium chloride, ethanol, phosphate, HEPES, potassium phosphate, sodium citrate, sodium phosphate, calcium chloride, EDTA, dithiothreitol, sodium acetate, sodium cacodylate, magnesium chloride, sodium azide, 2-methyl-2,4-pentanediol, sodium chloride, tris-HCl, ammonium sulfate, PEG (200–35000) (with PEG 4000, PEG 6000 and PEG 8000 being used most often out of the PEGs).

44. The method as claimed in claim 34, wherein the aged supersaturated solution has a pH of between 2 and 12.

45. The method as claimed in claim 44, wherein the aged supersaturated solution has a pH of approximately 4.0.

46. The method as claimed in claim 39, wherein the aged supersaturated solution is maintained at a temperature up to the boiling point of the solvent.

47. The method as claimed in claim 46, wherein the aged supersaturated solution is maintained at a temperature of approximately 25° C.

48. The method as claimed in claim 34, wherein the aged supersaturated solution comprises between 0.1% and 50% protein.

49. The method as claimed in claim 29, wherein the crystals are allowed to grow for a selected period of time, whereby the crystals grow to a size larger than those that would grow from an identical supersaturated solution that is allowed to spontaneously nucleate in the absence of the laser light.

50. The method as claimed in claim 34, wherein the supersaturated solution of the compound is produced by mixing the compound in the solvent and cooling the resultant mixture.

51. The method as claimed in claim 34, wherein the supersaturated solution of the compound is produced by mixing the compound in the solvent and allowing a portion of the solvent to evaporate over a period of time.

52. The method as claimed in claim 51, wherein the period of time is the aging period.

53. The method as claimed in claim 29, wherein the aging period is up to 7 days.

54. The method as claimed in claim 29, wherein the aging period is between 1 hour and 4 hours.

55. The method as claimed in claim 29, wherein the aging period is between 4 hours and 1 day.

56. The method as claimed in claim 29, wherein the aging period is between 1 day and 4 days.

57. The method as claimed in claim 29, wherein the aging period is between 2 days and 4 days.

58. The method as claimed in claim 29, wherein the aging period is between 4 days and 7 days.

59. A high throughputnon-photochemical method of inducing the nucleation of protein crystals comprising:

a. preparing a supersaturated solution of a protein;

b. placing a preselected amount of the supersaturated protein solution in a plurality of reaction vessels;

c. allowing the supersaturated protein solution to age for an aging period;

d. selecting a wavelength, power and polarization state of laser light necessary to induce crystallizationnucleation of protein crystals from the aged supersaturated protein solution; and e. subjecting the aged supersaturated protein solution in the plurality of reaction vessels to the laser light for a period of time so as to induce nucleation of the protein crystals, wherein the aged supersaturated protein solution in the plurality of reaction vessels is subjected to the laser light using a high-throughput technique resulting in the high throughput non-photochemical laser induced nucleation of the protein crystals within the reaction vessels.

60. The method as claimed in claim 59, wherein the high throughput technique is selected from the group consisting of subjecting the aged supersaturated protein solution to the laser light in a rapid sequential procedure and subjecting the aged supersaturated protein solution to the laser light concurrently.

61. The method as claimed in claim 60, wherein the aged supersaturated protein solution is subjected to the laser light until at least a portion of the compound in the aged supersaturated protein solution has crystallized into the protein crystals.

62. The method as claimed in claim 61, wherein the laser light is at such a wavelength that the aged supersaturated protein solution will not absorb the laser light.

63. The method as claimed in claim 62, wherein the laser light is pulsed.

64. The method as claimed in claim 63, wherein the laser light pulses at between 1 pulse and 100 pulses per second.

65. The method as claimed in claim 64, wherein the laser light pulses at approximately 10 pulses per second.

66. The method as claimed in claim 65, wherein the aged supersaturated protein solution is subjected to the laser light for a period of between 0.01 second and 60 seconds.

67. The method as claimed in claim 62, wherein the laser light is in the near infrared range.

68. The method as claimed in claim 62, wherein the aged supersaturated solution comprises the compound of interest in a solvent.

69. The method as claimed in claim 68, wherein the solvent is selected from the group consisting of organic solvents, inorganic solvents, and supercritical solvents.

70. The method as claimed in claim 69, wherein the aged supersaturated solution further comprises a buffer.

71. The method as claimed in claim 70, wherein the buffer is selected from the group consisting of acetate buffer, citrate buffer, phosphate buffer, sodium acetate buffer, sodium phosphate buffer, and potassium phosphate buffer.

72. The method as claimed in claim 68 further comprising a precipitant is selected from the group consisting of MES, 2-(N-morpholino)-ethanesulfonic acid, ammonium acetate, glycerol, spermine, cacodylate, potassium chloride, ethanol, phosphate, HEPES, potassium phosphate, sodium citrate, sodium phosphate, calcium chloride, EDTA, dithiothreitol, sodium acetate, sodium cacodylate, magnesium chloride, sodium azide, 2-methyl-2,4-pentanediol, sodium chloride, tris-HCl, ammonium sulfate, PEG (200–35000) (with PEG 4000, PEG 6000 and PEG 8000 being used most often out of the PEGs).

73. The method as claimed in claim 68, wherein the aged supersaturated solution has a pH of between 2 and 12.

74. The method as claimed in claim 68, wherein the aged supersaturated solution has a pH of approximately 4.0.

75. The method as claimed in claim 68, wherein the aged supersaturated solution is maintained at a temperature up to the boiling point of the solvent.

76. The method as claimed in claim 75, wherein the aged supersaturated solution is maintained at a temperature of approximately 25° C.

77. The method as claimed in claim 76, wherein the aged supersaturated solution comprises between 0.1% and 50% protein.

78. The method as claimed in claim 77, wherein the supersaturated solution of the compound is produced by mixing the compound in the solvent and cooling the resultant mixture.

79. The method as claimed in claim 77, wherein the supersaturated solution of the compound is produced by mixing the compound in the solvent and allowing a portion of the solvent to evaporate over a period of time.

80. The method as claimed in claim 79, wherein the period of time is the aging period.

81. The method as claimed in claim 59, wherein the aging period is up to 7 days.

82. The method as claimed in claim 59, wherein the aging period is between 1 hour and 4 hours.

83. The method as claimed in claim 59, wherein the aging period is between 4 hours and 1 day.

84. The method as claimed in claim 59, wherein the aging period is between 1 day and 4 days.

85. The method as claimed in claim 59, wherein the aging period is between 2 days and 4 days.

86. The method as claimed in claim 59, wherein the aging period is between 4 days and 7 days.

87. The method as claimed in claim 59, wherein the protein crystals are allowed to grow for a selected period of time, whereby the protein crystals grow to a size larger than those that would grow from an identical supersaturated solution that is allowed to spontaneously nucleate in the absence of the laser light.

* * * * *